(12) United States Patent
Chen

(10) Patent No.: US 10,121,762 B2
(45) Date of Patent: Nov. 6, 2018

(54) WAFER BONDING STRUCTURE AND WAFER BONDING METHOD

(71) Applicants: Semiconductor Manufacturing International (Shanghai) Corporation, Shanghai (CN); Semiconductor Manufacturing International (Beijing) Corporation, Beijing (CN)

(72) Inventor: Fu Cheng Chen, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/825,872

(22) Filed: Nov. 29, 2017

(65) Prior Publication Data
US 2018/0151535 A1 May 31, 2018

(30) Foreign Application Priority Data

Nov. 30, 2016 (CN) .......................... 2016 1 1081250

(51) Int. Cl.
*H01L 21/00* (2006.01)
*H01L 23/00* (2006.01)
(Continued)

(52) U.S. Cl.
CPC ........ *H01L 24/83* (2013.01); *H01L 21/02359* (2013.01); *H01L 21/187* (2013.01);
(Continued)

(58) Field of Classification Search
CPC ... H01L 2224/94; H01L 21/187; H01L 24/83; H01L 21/02359; H01L 2224/83889
See application file for complete search history.

(56) References Cited

U.S. PATENT DOCUMENTS

| 9,899,223 B2 * | 2/2018 | Wimplinger .......... H01L 21/187 |
| 2003/0032210 A1 * | 2/2003 | Takayama ......... H01L 21/76251 |
| | | 438/30 |

(Continued)

OTHER PUBLICATIONS

The European Patent Office (EPO) The Extended European Search Report for 17204256.6 dated Apr. 9, 2018 9 Pages.

(Continued)

*Primary Examiner* — Ngan Ngo
(74) *Attorney, Agent, or Firm* — Anova Law Group, PLLC

(57) ABSTRACT

Wafer bonding methods and wafer bonding structures are provided. An exemplary wafer bonding method includes providing a first wafer; forming a first interlayer dielectric layer and a first bonding layer passing through the first interlayer dielectric layer on the surface of the first wafer; providing a second wafer; forming a second interlayer dielectric layer and a second bonding layer passing through the second interlayer dielectric layer on surface of the second wafer; forming a self-assembling layer on at least one of a surface of the first interlayer dielectric layer and a surface of the second interlayer dielectric layer; and bonding the first wafer with the second wafer, the first bonding layer and the second bonding layer being fixed with each other, and the first interlayer dielectric layer and the second interlayer dielectric layer being fixed with each other by the self-assembling molecular layer.

14 Claims, 2 Drawing Sheets

(51) Int. Cl.
*H01L 27/06* (2006.01)
*H01L 21/02* (2006.01)
*H01L 21/18* (2006.01)

(52) U.S. Cl.
CPC .......... *H01L 27/0688* (2013.01); *H01L 2224/83095* (2013.01); *H01L 2224/83203* (2013.01); *H01L 2224/83395* (2013.01); *H01L 2224/83889* (2013.01); *H01L 2224/94* (2013.01)

(56) References Cited

U.S. PATENT DOCUMENTS

| | | | |
|---|---|---|---|
| 2004/0157407 A1* | 8/2004 | Tong | B23K 20/02 438/455 |
| 2006/0030135 A1* | 2/2006 | Hu | C23C 18/00 438/584 |
| 2007/0117350 A1* | 5/2007 | Seacrist | H01L 21/30604 438/459 |
| 2008/0124845 A1 | 5/2008 | Yu et al. | |
| 2009/0239354 A1* | 9/2009 | Suzawa | H01L 21/76254 438/458 |
| 2013/0153093 A1 | 6/2013 | Vandroux et al. | |
| 2014/0217356 A1* | 8/2014 | Bayram | H01L 33/14 257/13 |
| 2014/0220764 A1* | 8/2014 | Bayram | H01L 21/76251 438/458 |
| 2014/0261998 A1* | 9/2014 | Veerasamy | B82Y 30/00 156/247 |
| 2014/0283982 A1 | 9/2014 | Pan et al. | |
| 2015/0380592 A1* | 12/2015 | Newman | H01L 31/043 136/255 |
| 2017/0062569 A1* | 3/2017 | Jun | H01L 21/2007 |
| 2018/0076170 A1* | 3/2018 | Lin | H01L 24/83 |
| 2018/0082959 A1* | 3/2018 | Gelorme | H01L 23/562 |
| 2018/0095067 A1* | 4/2018 | Huff | G01N 33/48721 |

OTHER PUBLICATIONS

Moriceau, Hubert et al., "Overview of recent direct wafer bonding advances and applications." Advances in Natural Sciences: Nanoscience and Nanotechnology lop Publishing Ltd.UK, vol. 1, No. 4, 1 |Dec. 2010 (Dec. 1, 2010), XP002779260, ISSN: 2043-6254, DOI: 10.1088/2043.6262/1/4/043004.

* cited by examiner

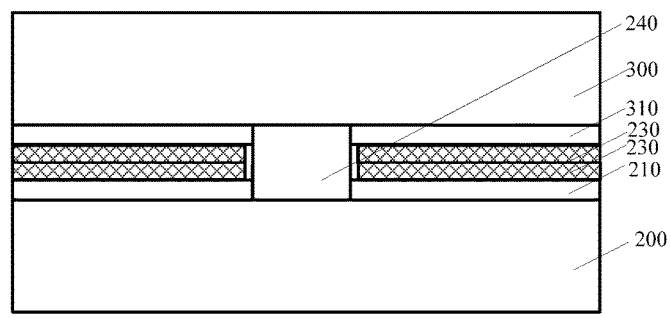

FIG. 4

| S101 |
| --- |
| Providing a first wafer and a second wafer; forming a first interlayer dielectric layer and a first bonding layer on the first wafer; and forming a second interlayer dielectrc layer and a second bonding layer on the second wafer |

| S102 |
| --- |
| Forming a self-assembling molecular layer on at least one of the surface of the first interlayer dielectric layer and the surface of the second interlayer dielectric layer |

| S103 |
| --- |
| Bonding the first wafer and the second wafer together by allowing the first bonding layer and the second bonding layer to be fixed together, and the first interlayer dielectric layer and the second interlayer dielectric layer to be fixed together by the self-assembling molecular layer |

FIG. 5

WAFER BONDING STRUCTURE AND WAFER BONDING METHOD

CROSS-REFERENCES TO RELATED APPLICATIONS

This application claims the priority of Chinese patent application No. 201611081250.8, filed on Nov. 30, 2016, the entirety of which is incorporated herein by reference.

FIELD OF THE DISCLOSURE

The present disclosure generally relates to the field of semiconductor manufacturing technologies and, more particularly, relates to wafer bonding structures and wafer bonding methods.

BACKGROUND

With the continue increase of the integration level of integrated circuits (ICs), the integration level has gradually reached the upper limitation. Thus, a three-dimensional (3D) IC technology has been developed. The 3D IC is defined as a system level integration structure. The 3D IC realizes the vertical interconnections of a plurality of chips by wafer bonding processes. Thus, the spaces of the chip is increased; and the integration level is increased as well. At the same time, the working speed of the ICs is also increased; and the power consumption is reduced. Currently, the 3D IC technology is one of the most important area in IC design.

3D IC technology often utilizes through silicon vias (TSVs) and the metal interconnect structures above the TSVs to form electrical interconnections; and then the wafer bonding is further realized between two wafers. As one of the key technologies in 3D IC, wafer level Cu—Cu bonding has an important application potential in the high-end products.

However, the bonding performance of the wafer bonding structure is not as expected. Thus, there is a need to further improve the bonding performance of the wafer bonding structures. The disclosed methods and structures are directed to solve one or more problems set forth above and other problems in the art.

BRIEF SUMMARY OF THE DISCLOSURE

One aspect of the present disclosure includes a wafer bonding method. The wafer bonding method includes providing a first wafer; forming a first interlayer dielectric layer and a first bonding layer passing through the first interlayer dielectric layer over surface of the first wafer; providing a second wafer; forming a second interlayer dielectric layer and a second bonding layer passing through the second interlayer dielectric layer on a surface of the second wafer; forming a self-assembling layer on at least one of a surface of the first interlayer dielectric layer and a surface of the second interlayer dielectric layer; and bonding the first wafer with the second wafer, the first bonding layer and the second bonding layer being fixed with each other, and the first interlayer dielectric layer and the second interlayer dielectric layer being fixed with each other by the self-assembling molecular layer.

Another aspect of the present disclosure includes a wafer bonding structure. The wafer bonding structure includes a first wafer and a corresponding second wafer; a first interlayer dielectric layer on a surface of the first wafer; a second interlayer dielectric layer corresponding to the first interlayer dielectric layer on the second wafer; a bonding member passing through the first interlayer dielectric layer and the second interlayer dielectric layer; and a self-assembling molecular layer between the first interlayer dielectric layer and the second interlayer dielectric layer; and cover the side surface of the bonding member.

Other aspects of the present disclosure can be understood by those skilled in the art in light of the description, the claims, and the drawings of the present disclosure.

BRIEF DESCRIPTION OF THE DRAWINGS

FIGS. 2-4 illustrate structures corresponding to certain stages of an exemplary wafer bonding process consistent with the disclosed embodiments; and FIG. 5 illustrates an exemplary wafer bonding process consistent with the disclosed embodiments.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
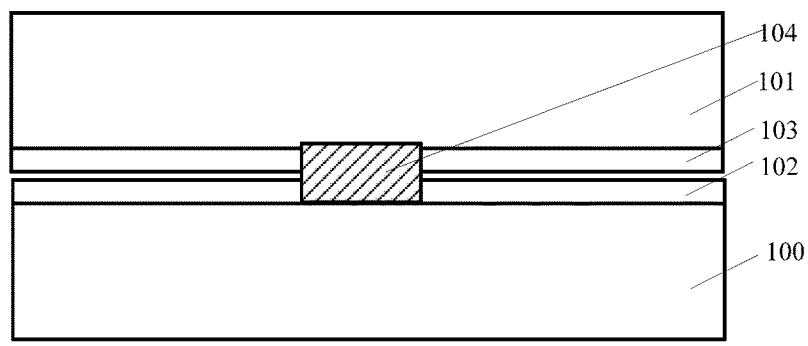
FIG. 1 illustrates a wafer bonding structure.

FIG. 1 illustrates a wafer bonding structure. The wafer bonding structure includes a first wafer 100; an opposing second wafer 101; a first interlayer dielectric layer 102 on the surface of the first wafer 100; a second interlayer dielectric layer 103 on the surface of the second wafer 101; and a bonding member 104 passing through the first interlayer dielectric layer 102 and the second interlayer dielectric layer 103 and between the first wafer 100 and the second wafer 101.

The process for forming the wafer bonding structure illustrated in FIG. 1 includes providing a first wafer and a second wafer. A first interlayer dielectric layer and a first bonding layer passing through the first interlayer dielectric layer are formed on the surface of the first wafer. The thickness of the first interlayer dielectric layer is greater than the thickness of the first bonding layer. A second interlayer dielectric layer and a second bonding layer passing through the second interlayer dielectric layer are formed on the surface of the second wafer. The thickness of the second interlayer dielectric layer is greater than the thickness of the second bonding layer. Further, the process includes aligning, and contacting the first interlayer dielectric layer with the second interlayer dielectric layer, and performing a thermal annealing process to cause the crystal grains of the first bonding layer and the second bonding layer to grow. Thus, the first bonding layer and the second layer are bonded together to form a bonding member.

However, the bonding quality of such a wafer bonding structure may be unacceptable because it is impossible to accurately control the thickness of the first interlayer dielectric layer relative to the first bonding layer and the thickness of the second dielectric layer relative to the second bonding layer. If the difference between the total thickness of the first interlayer dielectric layer and the second interlayer dielectric layer and the total thickness of the first bonding layer and the second bonding layer is too small, the preset space for the growth of the crystal grains of the first bonding layer and the second bonding layer is relatively small. Thus, after the thermal annealing process, the thickness of the formed bonding member is greater than the total thickness of the first interlayer dielectric layer and the second interlayer dielectric layer; and the thickness of the bonding member relative to the total thickness of the first interlayer dielectric layer and the second interlayer dielectric layer is too large. Thus, a gap is formed between the first interlayer dielectric layer and the second interlayer dielectric layer. Accordingly, the bonding properties of the first wafer and the second wafer may be unacceptable.

The present disclosure provides a wafer bonding method and a wafer bonding structure. The wafer bonding method may include providing a first wafer and a second wafer. A first interlayer dielectric layer and a first bonding layer passing through the first interlayer dielectric layer may be formed on the surface of the first wafer. A second interlayer dielectric layer and a second bonding layer passing through the second interlayer dielectric layer may be formed on the surface of the second wafer. The wafer bonding method may also include forming a self-assembling molecular layer on at least one of the surface of the first interlayer layer and the surface of the second interlayer dielectric layer; and performing a bonding process to bond the first bonding layer and the second bonding layer together, and bond the first interlayer dielectric layer the second interlayer dielectric layer by the self-assembling molecular layer.

In the disclosed method, the self-assembling molecular layer may be formed on the surface of the first interlayer dielectric layer and/or the second interlayer dielectric layer. Because the self-assembling molecular layer may be formed at the molecular level, the thickness of the self-assembling molecular layer may be precisely controlled. Thus, the total thickness of the first interlayer dielectric layer, the second interlayer dielectric layer and the self-assembling molecular layer relative to the total thickness of the first bonding layer and the second bonding layer may be precisely controlled. After bonding the first bonding layer and the second bonding layer, the gap between the first interlayer dielectric layer and the second interlayer dielectric layer may be prevented. Accordingly, the bonding quality of the first wafer the second wafer may be improved.

Figure 2:
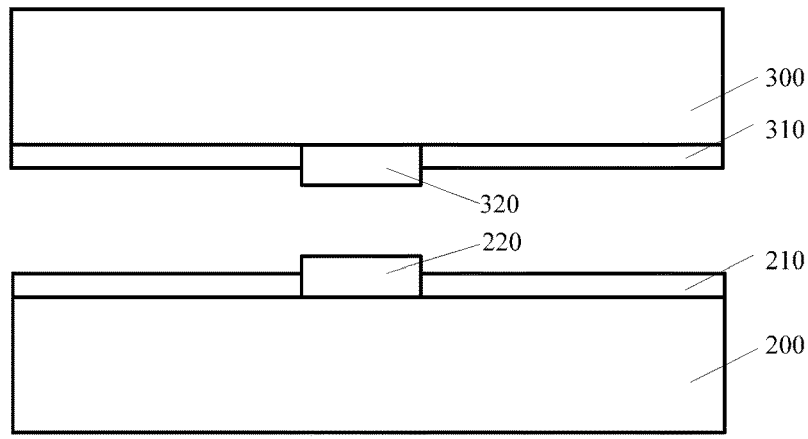
Figure 3:
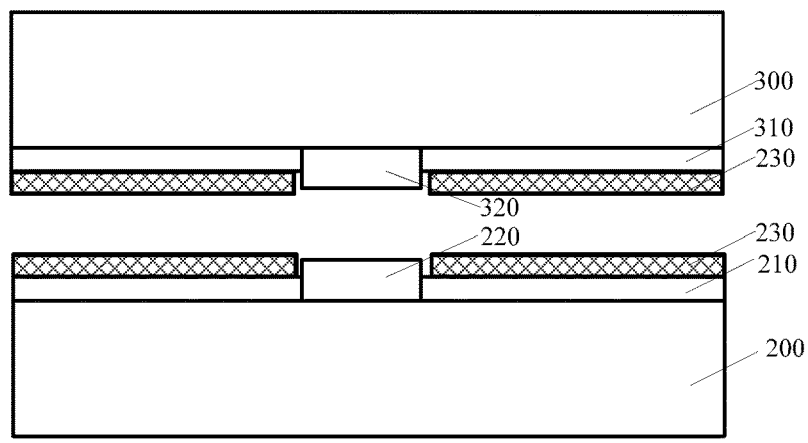

FIGS. 2-4 illustrate structures corresponding certain stages of an exemplary wafer bonding process consistent with the disclosed embodiments; and FIG. 5 illustrates the exemplary wafer bonding process consistent with the disclosed embodiments.

As shown in FIG. 5, at the beginning of the wafer bonding process, a first wafer and a second wafer are provided (S101). FIG. 2 illustrates a corresponding structure.

As shown in FIG. 2, a first wafer 200 and a second wafer 300 are provided. A first interlayer dielectric layer 210 and a first bonding layer 220 passing through the first interlayer dielectric layer 210 may be formed on the surface of the first wafer 200. A second interlayer dielectric layer 310 and a second bonding layer 320 passing through the second interlayer dielectric layer 310 may be formed on the surface of the second wafer 300.

CMOS devices (not shown), and/or other devices may be formed in the first wafer 200. Sensors, such as motion sensors and/or imaging sensors, etc., and/or other devices may be formed in the second wafer 300. The imaging sensors may include CMOS imaging sensors, etc. The CMOS integrate circuit may be electrically connected with the sensors.

The first interlayer dielectric layer 210 may be made of any appropriate material, such as silicon oxide, silicon oxynitride, or silicon oxycarbide, etc. The second interlayer dielectric layer 310 may be made of any appropriate material, such as silicon oxide, silicon oxynitride, or silicon oxycarbide, etc.

The first bonding layer 220 may be made of any appropriate metal material, such as Cu, Al, or Au, etc. The first bonding layer 220 may also be made of metal alloy. The second bonding layer 320 may be made of any appropriate metal material, such as Cu, Al, or Au, etc. The second bonding layer 320 may also be made of metal alloy.

When the first bonding layer 220 is made of metal material or metal alloy, the second bonding layer 320 may be made of silicon, or germanium, etc. When the second bonding layer 320 is made of metal material or metal alloy, the first bonding layer 220 may be made of silicon, or germanium, etc.

In one embodiment, the first bonding layer 220 and the second bonding layer 320 are made of a same material. Thus, the first bonding layer 220 and the second bonding layer 320 may be formed by a similar process. Accordingly, the fabrication process may be simplified. In some embodiments, the first bonding layer and the second bonding layer may be made of different materials.

The process for forming the first wafer 200, the first interlayer dielectric layer 210 and the first bonding layer 220 may include providing a first wafer 200 having a first surface and an opposing second surface; forming a first initial interlayer dielectric layer on the first surface of the first wafer 200; patterning the first initial interlayer dielectric layer to form the first interlayer dielectric layer 210 having a first opening (not labeled); forming a first initial bonding layer in the first opening and on the surface of the first interlayer dielectric layer 210; and planarizing the first initial bonding layer until the surface of the first interlayer dielectric layer 210 is exposed. Thus, the first bonding layer 220 passing through the first interlayer dielectric layer 210 may be formed.

Various processes may be used to form the first initial interlayer dielectric layer, such as a deposition process, etc. The first initial interlayer dielectric layer may be patterned by any appropriate process, such as an etching process using an etching mask. The planarization process may include a chemical mechanical polishing (CMP) process, etc.

In one embodiment, the during the CMP process for planarizing the first initial bonding layer, the polishing rate to the first initial bonding layer may be smaller than the polishing rate to the first interlayer dielectric layer 210. Thus, the thickness of the first bonding layer 220 may be greater the thickness of the first interlayer dielectric layer 210. Accordingly, as show in FIG. 2, the first bonding layer 220 may protrude from the top surface of the first interlayer dielectric layer 210.

In some embodiments, the top surface of the first bonding layer may level with the top surface of the first interlayer dielectric layer. In other embodiments, the thickness of the first bonding layer may be smaller than the thickness of the first interlayer dielectric layer.

The process for forming the second wafer 300, the second interlayer dielectric layer 310 and the second bonding layer 320 may include providing a second wafer 300 having a third surface and an opposing fourth surface; forming a second initial interlayer dielectric layer on the third surface of the second wafer 300; patterning the second initial interlayer dielectric layer to form the second interlayer layer dielectric layer 310 having a second opening (not labeled); forming a second initial bonding layer in the second opening and on the surface of the second interlayer dielectric layer 310; and planarizing the second initial bonding layer until the surface of the second interlayer dielectric layer 310 is exposed. Thus, the second bonding layer 320 passing through the second interlayer dielectric layer 310 may be formed.

Various processes may be used to form the second initial interlayer dielectric layer, such as a deposition process, etc. The second initial interlayer dielectric layer may be patterned by any appropriate process, such as an etching process using an etching mask. The planarization process may include a chemical mechanical polishing (CMP) process, etc.

In one embodiment, during the CMP process for planarizing the second initial bonding layer, the polishing rate to the second initial bonding layer may be smaller than the polishing rate to the second interlayer dielectric layer 310. Thus, the thickness of the second bonding layer 320 may be greater the thickness of the second interlayer dielectric layer 310. Accordingly, as show in FIG. 2, the second bonding layer 220 may protrude from the top surface of the second interlayer dielectric layer 310.

In some embodiments, the top surface of the second bonding layer may level with the top surface of the second interlayer dielectric layer. In other embodiments, the thickness of the second bonding layer may be smaller than the thickness of the second interlayer dielectric layer.

Returning to FIG. 5, after forming the second bonding layer, a self-assembling molecular layer may be formed (S102). FIG. 3 illustrates a corresponding structure.

A self-assembling molecular layer 230 is formed on at least one of the surface of the first interlayer dielectric layer 210 and the surface of the second interlayer dielectric layer 310. That is, the self-assembling molecular layer 230 may be formed on one of the first interlayer dielectric layer 210 and the second interlayer dielectric layer 310, or the self-assembling molecular layer 230 may be formed on both the first interlayer dielectric layer 210 and the second interlayer dielectric layer 310.

In one embodiment, as shown in FIG. 3, the self-assembling molecular layer 230 is formed on both the surface of the first interlayer dielectric layer 210 and the surface of the second interlayer dielectric layer 310. The self-assembling molecular layer 230 may include a first self-assembling molecular layer (not labeled) and a second self-assembling molecular layer (not labeled). The first self-assembling molecular layer may be on the surface of the first interlayer dielectric layer 210. The second self-assembling molecular layer may be on the surface of the second interlayer dielectric layer 310.

In one embodiment, the first self-assembling molecular layer and the second self-assembling molecular layer may be both monolayers. In some embodiments, the first self-assembling molecular and the second self-assembling molecular layer may be multiple layers.

When the first self-assembling molecular and the second self-assembling molecular layer are both monolayers, and the first self-assembling molecular layer and the second self-assembling molecular layer are bonded together, the thickness of the final bonded self-assembling molecular layer may be the total thickness of the two monolayers. When the designed thickness value of the self-assembling molecular layer 230 is relatively large, the requirement of the total thickness of the self-assembling molecular layer 230 may be met.

The process for forming the first self-assembling molecular layer may include forming a first self-assembling molecular material layer on the surface of the first interlayer dielectric layer 210 and the first bonding layer 220, followed by removing the portion of the first self-assembling molecular material layer on the first bonding layer 220. Accordingly, the first self-assembling molecular layer may be formed on the surface of the first interlayer dielectric layer 210.

The process for forming the first self-assembling molecular material layer may include performing a first plasma treatment process on the surface of the first interlayer dielectric layer 210 and the surface of the first bonding layer 220; performing a first hydroxylation process on the surface of the first interlayer dielectric layer 210 and the surface of the first bonding layer 220 to form hydroxyl groups; and introducing a first precursor gas group. The first precursor gas group may include a first precursor gas and water vapor. The first precursor gas and the water vapor may have a reaction to form a first intermediate product having absorption groups. The absorption groups in the first intermediate product and the hydroxyl groups on the surface of the first interlayer dielectric layer 210 and the surface of the first bonding layer 220 may be bonded together.

The gas of the first plasma treatment process may include oxygen, etc.

The first hydroxylation process may include exposing the first interlayer dielectric layer 210 and the first bonding layer 220 in air to allow the first interlayer dielectric layer 210 and the first bonding layer 220 to absorb the water molecular in air. In some embodiments, the first hydroxylation process may include introducing wafer vapor on the surface of the first interlayer dielectric layer 210 and the surface of the first bonding layer 220.

The first precursor gas may include $CF_3(CF_2)_7(CH_2)_2SiCl_3$, $CF_3(CF_2)_5(CH_2)_2SiCl_3$, $CF_3(CF_2)_5(CH_2)_2Si(OC_2H_5)_3$, $CF_3(CF_2)_5(CH_2)_2Si(CH_3)Cl_2$, $CF_3(CF_2)_5(CH_2)_2Si(CH_3)_2Cl$, or $CH_3(CH_2)_{17}SiCl_3$, etc.

The process for removing the first self-assembling molecular material layer on the surface of the first bonding layer 220 may include a baking process.

Because the bonding force between the first self-assembling molecular material layer and the first bonding layer 220 may be smaller than the bonding force between the first self-assembling molecular material layer and the first interlayer dielectric layer 210, the portion of the first self-assembling molecular material layer on the surface of the first bonding layer 220 may be removed and the portion of the first self-assembling molecular material layer on the surface of the first interlayer dielectric layer 210 may be retained when an appropriate temperature is used in the baking process.

In one embodiment, the temperature for baking the first self-assembling molecular material layer may be in a range of approximately 280° C.-320° C.

The process for forming the second self-assembling molecular layer may include forming a second self-assembling molecular material layer on the surface of the second interlayer dielectric layer 310 and the second bonding layer 320, followed by removing the portion of the second self-assembling molecular material layer on the second bonding layer 320. Accordingly, the second self-assembling molecular layer may be formed on the surface of the second interlayer dielectric layer 310.

The process for forming the second self-assembling molecular material layer may include performing a second plasma treatment process on the surface of the second interlayer dielectric layer 310 and the surface of the second bonding layer 320; performing a second hydroxylation process on the surface of the second interlayer dielectric layer 310 and the surface of the second bonding layer 320 to form hydroxyl groups; and introducing a second precursor gas group. The second precursor gas group may include a second precursor gas and water vapor. The second precursor gas and the water vapor may have a reaction to form a second intermediate product having absorption groups. The absorption groups in the second intermediate product and the hydroxyl groups on the surface of the second interlayer dielectric layer 310 and the surface of the second bonding layer 320 may be bonded together.

The gas of the second plasma treatment process may include oxygen, etc.

The second hydroxylation process may include exposing the second interlayer dielectric layer 310 and the second bonding layer 320 in air to allow the second interlayer dielectric layer 310 and the second bonding layer 320 to absorb the water molecular in air. In some embodiments, the second hydroxylation process may include introducing wafer vapor on the surface of the second interlayer dielectric layer 310 and the surface of the second bonding layer 320.

The second precursor gas may include $CF_3(CF_2)_7(CH_2)_2SiCl_3$, $CF_3(CF_2)_5(CH_2)_2SiCl_3$, $CF_3(CF_2)_5(CH_2)_2Si(OC_2H_5)_3$, $CF_3(CF_2)_5(CH_2)_2Si(CH_3)Cl_2$, $CF_3(CF_2)_5(CH_2)_2Si(CH_3)_2Cl$, or $CH_3(CH_2)_{17}SiCl_3$, etc.

The process for removing the second self-assembling molecular material layer on the surface of the second bonding layer 320 may include a baking process.

Because the bonding force between the second self-assembling molecular material layer and the second bonding layer 320 may be smaller than the bonding force between the second self-assembling molecular material layer and the second interlayer dielectric layer 310, the portion of the second self-assembling molecular material layer on the surface of the second bonding layer 320 may be removed and the portion of the second self-assembling molecular material layer on the surface of the second interlayer dielectric layer 310 may be retained when an appropriate temperature is used in the baking process.

In one embodiment, the temperature for baking the second self-assembling molecular material layer may be in a range of approximately 280° C.-320° C.

The first plasma treatment process and the second treatment process may be performed simultaneously. In some embodiments, the first plasma treatment process and the second plasma treatment process may be performed separately.

The first hydroxylation process and the second hydroxylation process may be performed simultaneously. In some embodiments, the first hydroxylation process and the second hydroxylation process may be performed separately.

The first precursor gas and the second precursor gas may be in a same gaseous condition. In some embodiments, the first precursor gas and the second precursor gas may be in different gaseous conditions.

In one embodiment, the thickness of the first self-assembling molecular layer may be in a range of approximately 5 Å-20 Å. The thickness of the second self-assembling molecular layer may be in a range of approximately 5 Å-20 Å. In some embodiments, the thickness of the first self-assembling molecular layer and the thickness of the second self-assembling molecular layer may be determined according to the practical processes.

In some embodiments, the first self-assembling molecular layer may only include the first self-assembling molecular layer. In some other embodiments, the self-assembling molecular layer may only include the second self-assembling molecular layer.

The self-assembling molecular layer 230 may be formed at a molecular level. Thus, the thickness of the self-assembling molecular layer 230 may be precisely controlled. Accordingly, the total thickness of the first interlayer dielectric layer 210, the second interlayer dielectric layer 310 and the self-assembling molecular layer 230 relative to the total thickness of the first bonding layer 220 and the second bonding layer 320 may be precisely controlled. Therefore, the process design requirements may be met.

In one embodiment, a barrier layer may be formed between the first bonding layer 220 and the first interlayer dielectric layer 210 and between the second bonding 320 and the second interlayer dielectric layer 310.

The barrier layer may be made of any appropriate material, such as TaN, Ta, TiN, or Ti, etc.

The barrier layer may be used to prevent the first bonding layer 220 from diffusing into the first interlayer dielectric layer 210 and the first wafer 200; and prevent the second bonding layer 320 from diffusing into the second interlayer dielectric layer 310 and the second wafer 300.

In some embodiments, the barrier layer may be formed only between the first bonding layer and the first interlayer dielectric layer. In other embodiments, the barrier layer may only be formed between the second bonding layer and the second interlayer dielectric layer.

In one embodiment, the total thickness of the first interlayer dielectric layer 210, the second interlayer dielectric layer 310 and the self-assembling molecular layer 230 may be greater than the total thickness of the first bonding layer 220 and the second bonding layer 320. In some embodiments, the total thickness of the first interlayer dielectric layer, the second interlayer dielectric layer and the self-assembling molecular layer may be smaller than the total thickness of the first bonding layer and the second bonding layer.

When the total thickness of the first interlayer dielectric layer 210, the second interlayer dielectric layer 310 and the self-assembling molecular layer 230 is smaller than the total thickness of the first bonding layer 220 and the second bonding layer 320, the difference between the total thickness of the first interlayer dielectric layer 210, the second interlayer dielectric layer 310 and the self-assembling molecular layer 230 and the total thickness of the first bonding layer 220 and the second bonding layer 320 is smaller than approximate 100 Å. Under such a condition, when a hot-pressing process is subsequently used to bond the first wafer 200 and the second wafer 300 together, the first wafer 200 and the second wafer 300 may have a substantially small deformation during the hot-processing process so as to allow the self-assembling molecular layer 230 on the first interlayer dielectric layer 210 to contact with the self-assembling molecular layer 230 on the surface of the second interlayer dielectric layer 310.

Returning to FIG. 4, after forming the self-assembling molecular layer, the first wafer and the second wafer may be bonded together (S103). FIG. 4 illustrates a corresponding structure.

As shown in FIG. 4, the first wafer 200 and the second wafer 300 may be bonded together to cause the first bonding layer 220 and the second bonding layer 320 to be fixed with each other, and cause the first interlayer dielectric layer 210 and the second interlayer dielectric layer 310 to be fixed with each other by the self-assembling molecular layer 230.

When the total thickness of the first interlayer dielectric layer 210, the second interlayer dielectric layer 310 and the self-assembling layer 230 is substantially equal to, or greater than the total thickness of the first bonding layer 220 and the second bonding layer 320, the process for bonding the first wafer 200 and the second wafer 300 may include a thermal annealing process.

The temperature of the thermal annealing process may be in a range of approximately 100° C.-500° C. The time of the thermal annealing process may be in a range of approximately 5 mins-6 mins.

If the temperature of the thermal annealing process is greater than 500° C., it may waste energy; and may also cause the self-assembling molecular layer 230 to severely overflow and peel off from the first interlayer dielectric layer 210 and the second interlayer dielectric layer 310. If the temperature of the thermal annealing process is lower than 100° C., the growth rate of the crystal grains in the first bonding layer 220 and the second bonding layer 320 may be too slow, the process efficiency may be reduced.

If the time of the thermal annealing process is greater than approximately 6 minutes, it may waste energy. If the time of the thermal annealing process is less than approximately 5 minutes, the crystal grains in the first bonding layer 220 and the second bonding layer 320 may not have enough time to grow to the stable size.

During the thermal annealing process, the crystal grains in the first bonding layer 220 and the second bonding layer 320 may grow; and may be bonded together under a certain temperature. At the same time, the first interlayer dielectric layer 210 and the second interlayer dielectric layer may be bonded together by the self-assembling molecular layer 230. The mechanism for bonding the first interlayer dielectric layer 210 and the second interlayer dielectric layer 310 is that the portion of the self-assembling layer 230 on the first interlayer dielectric layer 210 and the portion of the self-assembling layer 230 on the second interlayer dielectric layer 320 are bonded together by the van der Waals' force.

When the total thickness of the first interlayer dielectric layer 210, the second interlayer dielectric layer 310 and the self-assembling layer 230 is substantially smaller than, or equal to the total thickness of the first bonding layer 220 and the second bonding layer 320, a hot-pressing process may be used to bond the first bonding layer 220 and the second bonding layer 320 together.

The hot-pressing process may include applying heat and pressure on the first bonding layer 220 and the second bonding layer 320 to bond the first bonding layer 220 and the second bonding layer 320. The pressure of the hot-pressing process may be in a range of approximately 100 kPa-50 Mpa. The temperature of the hot-pressing process may be in a range of approximately 100° C.-600° C. The time of the hot-pressing process may be in a range of approximately 10 mins-120 mins.

The hot-pressing process may be used to bond the first bonding layer 220 and the second bonding layer 320, during the hot-pressing process, under a certain pressure, the first wafer 200 and the second wafer 300 may have slight deformations to allow the portion of the self-assembling layer 230 on the first interlayer dielectric layer 210 to contact with the portion of the self-assembling molecular layer 230 on the second interlayer dielectric layer 310; and the first interlayer dielectric layer 210 and the second interlayer dielectric layer 310 may be bonded together by the self-assembling layers 230. The mechanism for bonding the interlayer dielectric layer 210 and the second interlayer dielectric layer 310 by the self-assembling molecular layer 230 may be that the portion of the self-assembling molecular layer 230 on the first interlayer dielectric layer 210 and the portion of the self-assembling molecular layer 230 on the second interlayer dielectric layer 310 are boned by the van der Waals' force.

The total thickness of the first interlayer dielectric layer 210, the second interlayer dielectric layer 310 and the self-assembling molecular layers 230 relative to the total thickness of the first bonding layer 220 and the second bonding layer 320 may be precisely controlled. Thus, after bonding the first bonding layer 220 and the second bonding layer 320, a gap may be prevented from being formed between the first interlayer dielectric layer 210 and the second interlayer dielectric layer 310. Accordingly, the bonding quality of the first wafer 200 and the second wafer 300 may be improved.

Accordingly, the present disclosure also provides a wafer bonding structure. FIG. 4 illustrates a corresponding wafer bonding structure.

As shown in FIG. 4, the wafer bonding structure may include a first wafer 200 and a corresponding second wafer 300. The wafer bonding structure may also include a first interlayer dielectric layer 210 on the surface of the first wafer 200 and a corresponding second interlayer dielectric layer 310 on the surface of the second wafer 300. Further, the wafer bonding structure may also include a bonding member 240 passing through the first interlayer dielectric layer 210 and the second interlayer dielectric layer 310 and between the first wafer 200 and the second wafer 300. Further, the wafer bonding structure may also include at least one self-assembling layer 230 between the first interlayer dielectric layer 210 and the second interlayer dielectric layer 310 and covering the side surface of the bonding member 240. The detailed structures and intermediate structures are described above with respect to the fabrication processes.

The precursor of the self-assembling layer 230 may include $FETS(CF_3(CF_2)_7(CH_2)_2SiCl_3)$, $FOTS(CF_3(CF_2)_5(CH_2)_2SiCl_3)$, $FOTES(CF_3(CF_2)_5(CH_2)_2Si(OC_2H_5)_3)$, $FOMDS(CF_3(CF_2)_5(CH_2)_2Si(CH_3)Cl_2)$, $FOMMS(CF_3(CF_2)_5(CH_2)_2Si(CH_3)_2Cl)$, or $OTS(CH_3(CH_2)_{17}SiCl_3)$, etc.

The bonding member 240 may be made of a metal material, such as Cu, Al, or Au, etc. The bonding member 240 may also be made of an alloy.

The disclosed wafer bonding structure may include at least one self-assembling molecular layer 230. The self-assembling molecular layer 230 may be between the first interlayer dielectric layer 210 and the second interlayer dielectric 310; and may cover the side surface of the bonding member 240. Because the self-assembling layer 230 may be formed at the molecular level, the thickness of the self-assembling layer 230 may be precisely controlled. The self-assembling molecular layer 230 may be used to compensate the difference between the thickness of the bonding member 240 and the total thickness of the first interlayer dielectric layer 210 and the second interlayer dielectric layer 310. Thus, a gap may be prevented from being forming between the first interlayer dielectric layer 210 and the second interlayer dielectric layer 310. Accordingly, the bonding quality of the first wafer 200 and the second wafer 300 may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A wafer bonding method, comprising:
providing a first wafer;
forming a first interlayer dielectric layer and a first bonding layer passing through the first interlayer dielectric layer on a surface of the first wafer;
providing a second wafer;
forming a second interlayer dielectric layer and a second bonding layer passing through the second interlayer dielectric layer on a surface of the second wafer;
forming a self-assembling molecular layer on at least one of a surface of the first interlayer dielectric layer and a surface of the second interlayer dielectric layer; and
bonding the first wafer with the second wafer, the first bonding layer and the second bonding layer being fixed with each other, and the first interlayer dielectric layer and the second interlayer dielectric layer being fixed with each other by the self-assembling molecular layer.

2. The wafer bonding method according to claim 1, wherein:
the self-assembling molecular layer includes at least one of a first self-assembling molecular layer and a second self-assembling molecular layer;
the first self-assembling layer is on the surface of the first interlayer dielectric layer; and
the second self-assembling layer is on the surface of the second interlayer dielectric layer.

3. The wafer bonding method according to claim 2, wherein forming the first self-assembling molecular layer comprises:
forming a first self-assembling molecular material layer on the surface of the first interlayer dielectric layer and the surface of the first bonding layer; and
removing a portion of the first self-assembling molecular material layer on the first bonding layer.

4. The wafer bonding method according to claim 3, wherein forming the first self-assembling molecular material layer comprises:
performing a first plasma treatment process on the surface of the first interlayer dielectric layer and the surface of the first bonding layer;
performing a first hydroxylation process on the surface of the first interlayer dielectric layer and the first bonding layer to form hydroxyl groups on the surface of the first interlayer dielectric layer and the first bonding layer; and
introducing a first precursor gas group including a first precursor and water vapor,
wherein:
the first precursor gas and the water vapor have a reaction to form a first intermediate product having absorption groups; and
the absorption groups in the first intermediate product and the hydroxyl groups on the surface of the first bonding layer and the first interlayer dielectric are bonded together.

5. The wafer bonding method according to claim 4, wherein:
a gas of the first plasma treatment process includes oxygen; and
the first hydroxylation process includes one of exposing the first interlayer dielectric and the first bonding layer in air, and introducing water vapor on the surface of the first interlayer dielectric layer and the surface of the first bonding layer.

6. The wafer bonding method according to claim 4, wherein:
the first precursor gas includes one or more of $CF_3(CF_2)_7(CH_2)_2SiCl_3$, $CF_3(CF_2)_5(CH_2)_2SiCl_3$, $CF_3(CF_2)_5(CH_2)_2Si(OC_2H_5)_3$, $CF_3(CF_2)_5(CH_2)_2Si(CH_3)Cl_2$, $CF_3(CF_2)_5(CH_2)_2Si(CH_3)_2Cl$, and $CH_3(CH_2)_{17}SiCl_3$.

7. The wafer bonding method according to claim 4, wherein forming the second self-assembling molecular layer comprises: forming a second self-assembling molecular material layer on the surface of the second interlayer dielectric layer and the surface of the second bonding layer; and removing a portion of the second self-assembling molecular material layer on the second bonding layer.

8. The wafer bonding method according to claim 7, wherein forming the second self-assembling molecular material layer comprises:
performing a second plasma treatment process on the surface of the second interlayer dielectric layer and the surface of the second bonding layer;
performing a second hydroxylation process on the surface of the second interlayer dielectric layer and the second bonding layer to form hydroxyl bonds on the surface of the second interlayer dielectric layer and the second bonding layer; and
introducing a second precursor gas group including a second precursor and water vapor,
wherein:
the second precursor gas and the water vapor have a reaction to form a second intermediate product having absorption groups; and
the absorption groups in the second intermediate product and the hydroxyl groups on the surface of the second bonding layer are bonded together.

9. The wafer bonding method according to claim 8, wherein:
a gas of the second plasma treatment process includes oxygen; and
the second hydroxylation process includes one of exposing the second interlayer dielectric and the second bonding layer in air, and introducing water vapor on the surface of the second interlayer dielectric layer and the surface of the second bonding layer.

10. The wafer bonding method according to claim 8, wherein:
the second precursor gas includes one or more of $CF_3(CF_2)_7(CH_2)_2SiCl_3$, $CF_3(CF_2)_5(CH_2)_2SiCl_3$, $CF_3(CF_2)_5(CH_2)_2Si(OC_2H_5)_3$, $CF_3(CF_2)_5(CH_2)_2Si(CH_3)Cl_2$, $CF_3(CF_2)_5(CH_2)_2Si(CH_3)_2Cl$, and $CH_3(CH_2)_{17}SiCl_3$.

11. The wafer bonding method according to claim 1, wherein: the first bonding layer and the second bonding layer are bonded together by a thermal annealing process and a total thickness of the first interlayer dielectric, the second interlayer dielectric layer and the self-assembling molecular layer is greater than, or substantially equal to a total thickness of the first bonding layer and the second bonding layer.

12. The wafer bonding method according to claim 11, wherein:
a temperature of the thermal annealing process is in a range of approximately 100° C.-500° C.; and
a time of the thermal annealing process is in a range of approximately 5 minutes-6 mins.

13. The wafer bonding method according to claim 1, wherein: the first bonding layer and the second bonding layer are bonded together by a hot-pressing process and a total thickness of the first interlayer dielectric, the second interlayer dielectric layer and the self-assembling molecular layer is smaller than, or substantially equal to a total thickness of the first bonding layer and the second bonding layer.

14. The wafer bonding method according to claim 13, wherein:
- a pressure of the hot-pressing process is in a range of approximately 100 KPa-50 MPa;
- a temperature of the hot-pressing process is in a range of approximately 100° C.-600° C.; and
- the hot-pressing process is performed for approximately 10 minutes-120 minutes.

* * * * *